US012676469B2

(12) United States Patent
Benabdelaziz et al.

(10) Patent No.: US 12,676,469 B2
(45) Date of Patent: Jul. 7, 2026

(54) SHORT-CIRCUIT DETECTION DEVICE

(71) Applicant: STMicroelectronics International N.V., Geneva (CH)

(72) Inventors: Ghafour Benabdelaziz, Tours (FR); Jean Pierre Proot, Saint Cyr sur Loire (FR)

(73) Assignee: STMicroelectronics International N.V., Geneva (CH)

(*) Notice: Subject to any disclaimer, the term of this patent is extended or adjusted under 35 U.S.C. 154(b) by 245 days.

(21) Appl. No.: 18/737,847

(22) Filed: Jun. 7, 2024

(65) Prior Publication Data

US 2024/0421584 A1     Dec. 19, 2024

(30) Foreign Application Priority Data

Jun. 13, 2023     (FR) ...................................... 2306003

(51) Int. Cl.
| | |
|---|---|
| *H02H 3/087* | (2006.01) |
| *G01R 31/28* | (2006.01) |
| *H02H 9/00* | (2006.01) |
| *H02J 7/34* | (2006.01) |

(52) U.S. Cl.
CPC ......... *H02H 3/087* (2013.01); *G01R 31/2836* (2013.01); *H02H 9/002* (2013.01); *H02J 7/345* (2013.01)

(58) Field of Classification Search
CPC .... H02H 3/087; H02H 9/002; G01R 31/2836; G01R 31/52; H02J 7/345
See application file for complete search history.

(56) References Cited

U.S. PATENT DOCUMENTS 8,339,153 B2 * 12/2012 Zha .................... G01R 31/3336
324/762.1

FOREIGN PATENT DOCUMENTS

| | | | | |
|---|---|---|---|---|
| CN | 101515710 A | 8/2009 | | |
| CN | 108448548 A | 8/2018 | | |
| CN | 115128426 A | * 9/2022 | ............. | G01R 31/52 |
| EP | 3321948 A1 | * 5/2018 | ............. | H01H 9/548 |

* cited by examiner

*Primary Examiner* — Crystal L Hammond
*Assistant Examiner* — Samantha L Faubert
(74) *Attorney, Agent, or Firm* — Seed Intellectual Property Law Group LLP

(57)     ABSTRACT

The present disclosure relates to a short-circuit detection device in a direct current circuit, including a voltage source, a bus including at least two conducting elements each coupled to either one of the terminals of the voltage source, first and second thyristors coupled to the voltage source and to the bus, and at least one capacitive element forming a storage capacitor, whose electrodes are each coupled to either one of the conducting elements of the bus, wherein the short-circuit detection device includes at least one control circuit configured to control the biasing and the modes of operation of the first and second thyristors such that a short circuit detection phase is implemented before a pre-charge of the storage capacitor.

20 Claims, 3 Drawing Sheets

SHORT-CIRCUIT DETECTION DEVICE

CROSS-REFERENCE TO RELATED APPLICATION(S)

This application claims the priority benefit of French patent application number 2306003, filed on Jun. 13, 2023, entitled "Dispositif de detection de court-circuit," which is hereby incorporated by reference to the maximum extent allowable by law.

BACKGROUND

Technical Field

The present disclosure relates generally to a short-circuit detection device.

Description of the Related Art

In a direct current circuit, for example in an electrical vehicle, the battery of the vehicle is coupled to a bus comprising two conducting elements, each coupled respectively to one of the terminals of the battery. The capacitive elements of the circuit coupled to the bus may be considered as a bulk or storage capacitor that is coupled in parallel with the battery through the conducting elements of the bus and relays that make it possible to connect and disconnect the battery to/from the bus.

When the relays are closed in order to connect the bus to the battery, an intense inrush current flows between the battery and the storage capacitor. To prevent this inrush current, the storage capacitor is generally pre-charged with a pre-charging current before closing the relays. To do this, it is possible to couple, in parallel with one of these relays, a pre-charging circuit comprising a pre-charging resistor and a switch. The pre-charging of the storage capacitor is achieved by closing this switch and keeping open the relay that is coupled in parallel with the pre-charging circuit, while the other relay is closed. This pre-charging phase is implemented for a duration that is long enough to obtain the desired pre-charging voltage at the terminals of the storage capacitor.

If there is a short circuit in the direct current circuit, an intense current flows through the switch and may damage the other elements that are coupled to the bus. When the switch of the pre-charging circuit is a thyristor, turning off the thyristor to stop this short-circuit current involves an additional circuit.

When the switch of the pre-charging circuit is a relay, the relay can simply be opened in order to stop this short-circuit current. However, considering the delay required to open the relay, the short-circuit current may have time to damage the other elements that are coupled to the bus. In addition, this opening delay of the relay increases with time.

BRIEF SUMMARY

There is a need for a solution to deal with the problems of the existing solutions.

A particular embodiment provides a solution to at least part of these problems and proposes a short-circuit detection device for detecting short-circuits in a direct current circuit, comprising at least one voltage source, a bus comprising at least two conducting elements each coupled to either one of the terminals of the voltage source, first and second thyristors coupled to the voltage source and to the bus, and at least one capacitive element forming a storage capacitor, electrodes of which are each coupled to either one of the conducting elements of the bus, wherein the short-circuit detection device comprises at least one control circuit configured to control the biasing and the modes of operation of the first and second thyristors such that: during a detection phase of a short-circuit, the first thyristor is set to an off state and the second thyristor is reverse-biased and conducts a non-zero reverse current that charges the storage capacitor, then a voltage at the terminals of the storage capacitor is determined; then, if the determined voltage at the terminals of the storage capacitor is lower than or equal to a short-circuit threshold value, the first and second thyristors are turned off, or if the determined voltage at the terminals of the storage capacitor is higher than the short-circuit threshold value, the storage capacitor is pre-charged by turning off the second thyristor and by turning on the first thyristor.

According to one embodiment, the short-circuit threshold value is equal to 0.

According to one embodiment: the voltage source is a direct voltage source comprising at least one battery; the direct current circuit comprises at least a first switch coupling a positive terminal of the battery to a first one of the two conducting elements of the bus, and at least a second switch coupling a negative terminal of the battery to a second one of the two conducting elements of the bus; at least one of the first and second switches is a relay; the direct current circuit comprises a discharge circuit of the storage capacitor comprising at least a third switch coupled in series with at least one discharge resistor, the discharge circuit being coupled in parallel with the storage capacitor; the first thyristor is part of a pre-charging circuit that also includes a pre-charging resistor coupled in series with the first thyristor, wherein the pre-charging circuit is coupled in parallel with one of the first and second switches, and such that the cathode of the first thyristor is coupled to the negative terminal of the battery or the anode of the first thyristor is coupled to the positive terminal of the battery; and the second thyristor is coupled in parallel with one of the first and second switches and such that the anode of the second thyristor is coupled to the negative terminal of the battery or the cathode of the second thyristor is coupled to the positive terminal of the battery.

According to one embodiment, the control circuit is configured to apply control signals to gates of the first and second thyristors, or the short-circuit detection device further comprises a Zener diode and an RC circuit, the anode of the Zener diode being coupled to the gate of the first thyristor, the cathode of the Zener diode being coupled to the anode of the second thyristor and to a first terminal of the RC circuit, a second terminal of the RC circuit being coupled to the cathode of the first thyristor.

According to one embodiment, the control circuit is configured to: before the short-circuit detection phase, close the first switch, then perform an initial measurement of the voltage at the terminals of the storage capacitor; then initiate the short-circuit detection phase if the initial voltage measurement at the terminals of the storage capacitor is lower than or equal to the short-circuit threshold value, or directly pre-charge the storage capacitor if the voltage initially measured at terminals of the storage capacitor is higher than the threshold value of short-circuit.

According to one embodiment, if the anode of the second thyristor is coupled to the negative terminal of the battery, the control circuit is configured to control the first switch so that it is on during the short-circuit detection phase and during the pre-charging of the storage capacitor.

According to one embodiment, the control circuit is configured such that, after the pre-charging of the storage capacitor, the first and second switches are turned on and the first and second thyristors are turned off.

According to one embodiment, the third switch is a third thyristor, and the control circuit is configured to apply a control signal to the gate of the third thyristor.

According to one embodiment, during a disconnection phase of the battery from the bus performed after the pre-charging of the storage capacitor, the control circuit is configured to turn on the third switch after the opening of the first and second switches.

According to one embodiment, during the measurement of the voltage at the terminals of the storage capacitor implemented during the short-circuit detection phase, the control circuit is configured to turn off the second thyristor.

According to another embodiment, there is provided a vehicle battery control system comprising at least one short-circuit detection device as proposed above.

According to another embodiment, there is provided an electrical power converter comprising at least one short-circuit detection device as proposed above.

According to one embodiment, the first and second thyristors are part of commutation cells of the electrical power converter.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, the operations and elements that are useful for an understanding of the embodiments described herein have been illustrated and described in detail. In particular, various elements (power source, bus, thyristor, control circuit, etc.) of the short-circuit detection device are not described in detail. A person skilled in the art will be able to implement, in a detailed manner, these elements based on the functional description provided herein.

Unless indicated otherwise, when reference is made to two elements connected together, this signifies a direct connection without any intermediate elements other than conductors, and when reference is made to two elements coupled together, this signifies that these two elements may be connected or they may be coupled via one or more other elements.

Unless specified otherwise, the expressions "around," "approximately," "substantially" and "in the order of" signify within 10%, and preferably within 5%.

Figure 2:
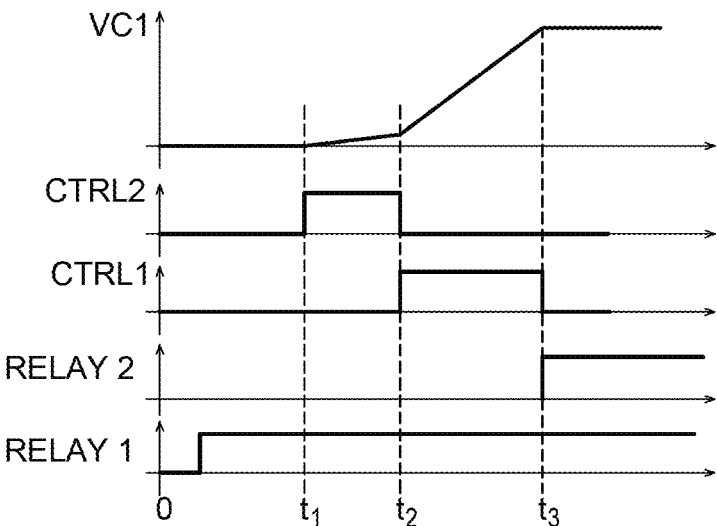
FIGS. 2 and 3 show timing diagrams of signals of the short-circuit detection device according to the first example embodiment.
Figure 3:
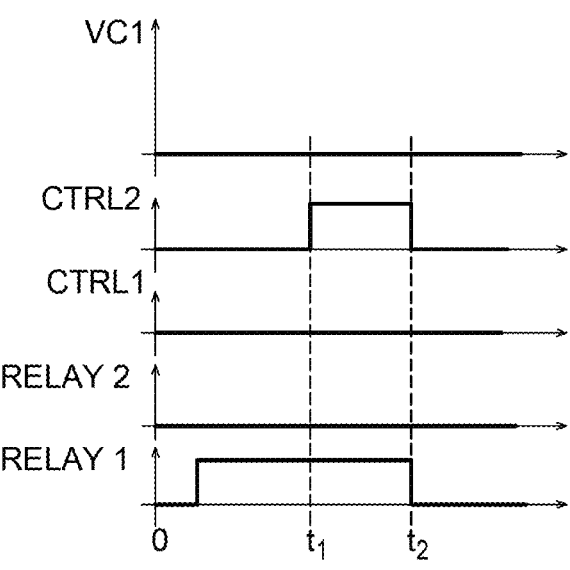
Figure 5:
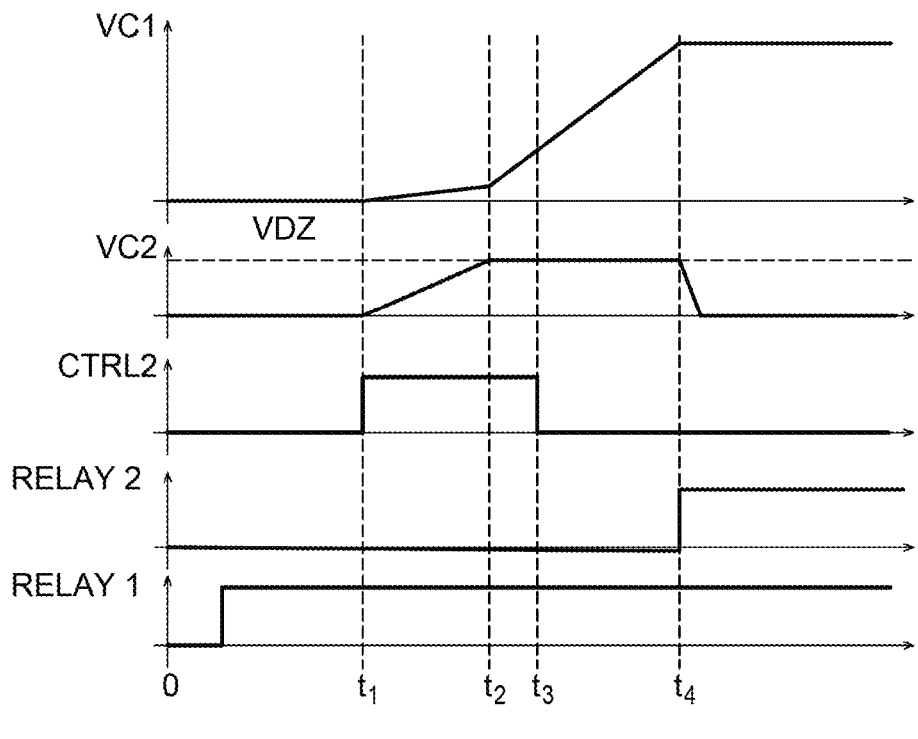
FIG. 5 shows timing diagrams of signals of the short-circuit detection device according to the second embodiment.

In addition, the timing diagram signals of FIGS. 2, 3, and 5 are represented schematically and not on the same scale in terms of amplitude and duration of the various parts of these signals. Thus, the signals symbolically shown as rectangular signals on these figures may correspond to pulse signals or other shapes of signals.

A first example of a short-circuit detection device 100 is described below in relation with the FIG. 1.

In this first embodiment, the device 100 makes it possible to detect a short-circuit in a direct current circuit, for example part of a system 1000 to command vehicle batteries, such as an electric car, before the battery is coupled to the direct current bus of the vehicle.

The direct current circuit comprises at least one voltage source 102 that, in this first example, is a direct voltage source comprising at least one battery and outputting a direct current. As an example, the voltage at the terminals of the battery is ca. 400 V or 800 V.

A direct current circuit also includes a bus comprising at least two conducting elements 104, 106 each coupled to either one of the terminals of the voltage source 102. In a first embodiment described, the first conducting element 104 is coupled to the positive terminal of the voltage source 102 through a first switch 108, and the second conducting element 106 is coupled to the negative terminal of the voltage source 102 through a second switch 110.

In this first embodiment, at least one of the first and second switches 108, 110 is a relay, such that it is possible to physically cut the voltage source 102 from the bus without any leakage. On the example of FIG. 1, the two switches 108, 110 are relays. As a variant, one of the two switches 108, 110 may not be a relay and may, for example, be a semiconductor system, such as a power transistor or any other electronic component suitable to form such a switch.

The device 100 also comprises first and second thyristors 112, 114 coupled to the voltage source 102 and to the bus.

In the first embodiment as described, the first thyristor 112 is part of a pre-charging circuit that also comprises a pre-charging resistor 116 serially coupled to the first thyristor 112. The pre-charging circuit is coupled in parallel with the first and second switches 108, 110 (in parallel of the second switch 110 on the example of the FIG. 1). In addition, on the example of FIG. 1, the cathode of the first thyristor 112 is coupled to the negative terminal of the voltage source 102. As a variant, the pre-charging circuit may be coupled in parallel with the first switch 108; in this case, the anode of the first thyristor 112 is coupled to the positive terminal of the voltage source 102.

Figure 1:
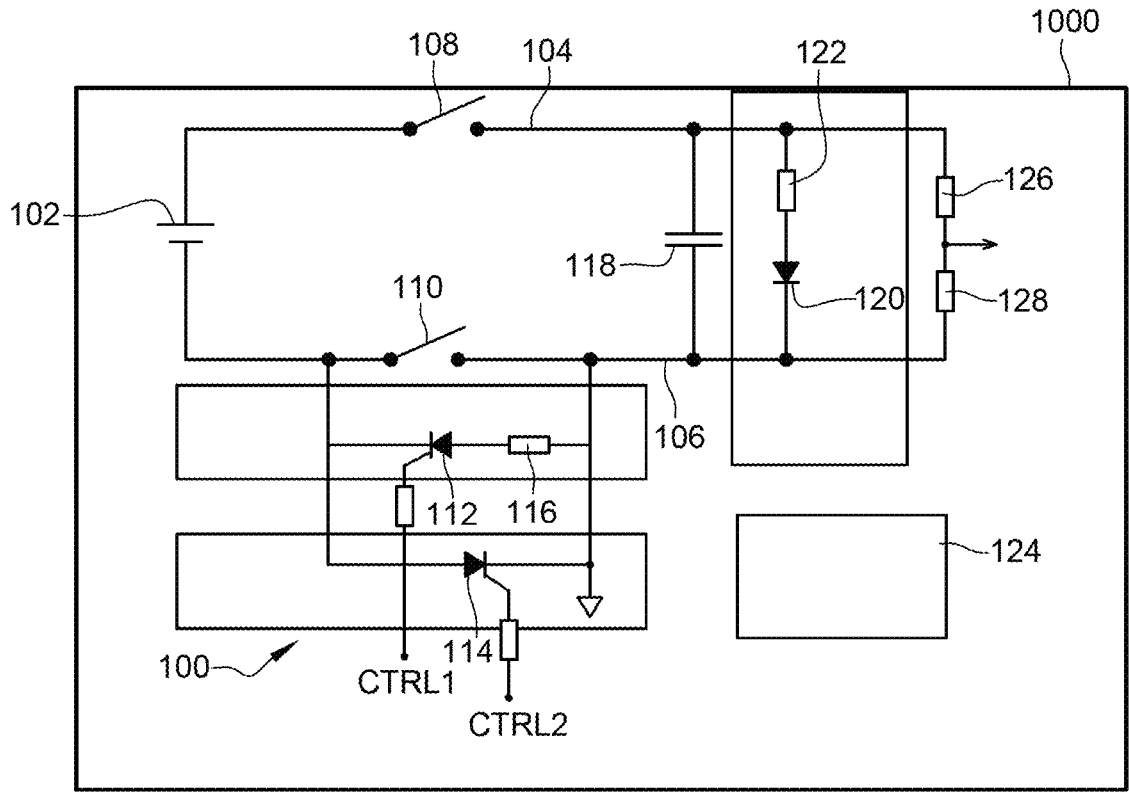
FIG. 1 schematically shows a first example embodiment of a short-circuit detection device according to a particular embodiment.

On the example of FIG. 1, the second thyristor 114 constitutes a short-circuit detection circuit that is coupled in parallel with one of the first and second switches 108, 110. On the example of FIG. 1, the second thyristor 114 is coupled in parallel with the second switch 110. In addition, the anode of the second thyristor 114 is coupled to the negative terminal of the voltage source 102. As a variant, the second thyristor 114 may be coupled in parallel with the first switch 108; in this case, the cathode of the second thyristor 114 is coupled to the positive terminal of the voltage source 102.

In this particular embodiment, the direct current circuit comprises one or more capacitive elements that together form a storage capacitor 118, also known as a bulk capacitor, where each electrode is coupled to either one of the conducting element 104, 106 of the bus.

In this embodiment, the device 100 also comprises a discharge circuit of the storage capacitor 118 comprising at least a third switch 120 with a series connection to at least one discharge resistor 122. This discharge circuit is coupled in parallel with the storage capacitor 118. On the example of FIG. 1, the third switch 120 is a third thyristor.

The device 100 also comprises at least one control circuit 124, comprising, for example, at least one microcontroller configured to control the biasing of the first, second and third thyristors 112, 114, 120, particularly thanks to the command to open and close each first and second switches 108, 110, and the modes of operation of the first, second and third thyristors 112, 114, 120. In the first example, the modes of operation of the first, second and third thyristors 112, 114, 120 are controlled thanks to control signals applied to the gates of the thyristors 112, 114, 120 from the control circuit 124. In the FIG. 1, a control signal «CTRL1» is applied on the gate of the first thyristor 112, a control signal «CTRL2» is applied on the gate of the second thyristor 114 and a control signal «CTRL3» is applied on the gate of the third thyristor 120. In the FIG. 1, the electrical connections between the switches 108, 110 and the control circuit 124 and between the thyristors 112, 114, 120 and the control circuit 124 are not shown.

In a particular described embodiment, the device 100 also comprises a voltage divider bridge coupled to the conducting elements 104, 106 of the bus in parallel with the storage capacitor 118. In the example of FIG. 1, this voltage divider bridge comprises two resistors 126, 128. If the values of the resistances 126, 128 are known, the voltage as measured at the terminals of either resistor 126, 128 makes it possible to determine the value of voltage at the terminals of the storage capacitor 118, which means the voltage at the direct current bus.

In addition, in the example of FIG. 1, the gates of the first and second thyristors 112, 114, are coupled to resistors, through which the control signals are applied.

Although it is not shown, there may be a fused terminal between the voltage source 102 and the bus. In addition, other components or circuits, such as power converters, may also be coupled to the bus, while these components are not shown on the various figures.

An example of a process implemented by the device 100 as described above in relation with the FIG. 1 is described below. The FIG. 2 shows examples of control signals and measurements that are obtained with this process and match a connection process of the voltage source 102 to the bus with a previous check of the presence of any short-circuit on the direct current circuit. The FIG. 3 shows the same signals in case of detection of a short circuit on the circuit, which means to keeping the voltage source 102 disconnected from the bus.

In the FIGS. 2 and 3, a high value of the signals «RELAY1» and «RELAY2» means a command to close the switches 108, 110 while a low value of these signals means a command to open these switches 108, 110. In addition, a high value of the signals «CTRL1» and «CTRL2» means a command to turn on the thyristors 112, 114 while a low value of these signals means a command to turn off these thyristors 112, 114.

In the described embodiment, at the initial state of this process, the first and second switches 108, 110 are open and the first, second and third thyristors 112, 114, 120 are off.

In a first phase of the process that corresponds to a duration between the time to and the time $t_1$ on the FIGS. 2 and 3, the control circuit 124 sends the first switch 108 a first control signal, called «RELAY1» on the FIGS. 2 and 3, which orders closing the switch.

In this example, the voltage at the terminals of the storage capacitor 118 is calculated during this first phase, for example from a measurement of the voltage at the terminals of one of the resistors 126, 128, and compared to a short-circuit threshold value. For example, this short-circuit threshold value is equal to 0 and defines a limit, such that if, during this first phase, the voltage at the terminals of the storage capacitor 118 is higher than this threshold value, it means that there is no short-circuit in the direct current circuit. The method may then directly carry out the pre-charge stage of the bulk capacitor 118 described later.

If, during the first stage of the method, the voltage at terminals of the bulk capacitor 118 stays below or equal to this threshold value, this means that the bulk capacitor 118 is not electrically charged or that a short-circuit is present in the direct current circuit. In the examples of the FIGS. 2 and 3, the voltage of the terminals of the storage capacitor 118, called «VC1», remains zero even after closing the first switch 108, which means that there may be a short-circuit in the direct current circuit. A short-circuit detection stage is in this case implemented.

The short-circuit detection circuit is implemented between the times $t_1$ and $t_2$ shown in the FIGS. 2 and 3. During this phase, the first thyristor 112 is off (in the FIGS. 2 and 3, the control signal «CTRL2» sent by the control circuit 124 onto the gate of the first thyristor 112 remains zero) and the second thyristor 114, that is reverse-biased, leads a non-zero reverse current during the duration $t_2$–$t_1$. This conduction of a reverse current by the second thyristor 114 is obtained thanks to the reverse biasing and the application by the control circuit 124 of a current onto the gate of the second thyristor 114 that generates this conduction. The value of the reverse current obtained is proportional to the value of the current applied to the gate of the second thyristor 114, the value of the proportionality coefficient β between these two currents depending on features of the second thyristor 114. As an example, the current applied onto the gate of the second thyristor 114 may be ca. 16 mA, or more generally between 10 mA and 16 mA in order to get a reverse-conduction current between 6 mA and 10 mA.

In the FIG. 2, this reverse-conduction current flowing through the second thyristor 114 generates a slow discharge of the storage capacitor 118, hence a small increase of the voltage at the terminals of the storage capacitor 118. As an example, this small increase of the voltage at the terminals may be equal to 10 V, or more generally between 1% and 5% of the battery voltage. In the FIG. 3, this small reverse-conduction current flowing through the second thyristor 114 does not charge the storage capacitor 118 because of a short-circuit in the direct current circuit. For example, this voltage is determined from a measurement at the voltage divider bridge, then it is compared to the short-circuit threshold value.

The duration t of the short-circuit detection phase is calculated from the following relation:

$$t = C \times \frac{\Delta V}{I_R} \qquad \text{Math 1}$$

where C is the value of the storage capacitor 118, $\Delta V$ is the increase of the voltage at the terminals of the storage capacitor 118, and IR is the reverse-conduction current that charges the storage capacitor 118. As an example, for a current IR equal to 16 mA, a capacitor C equal to 0.67 mF and a voltage increase $\Delta V$ equal to 10 V, the duration t is equal to 425 ms.

If the determined voltage is equal to or lower than the short-circuit threshold value, for example equal to 0 in the example described here, the first and second thyristors 112, 114 are turned off, and the process is finished, since it means that a short-circuit is detected in the direct current circuit. In this case, the voltage source 102 is not connected to the bus. This case corresponds to the one shown in FIG. 3, where the voltage VC1 is zero at time $t_2$. In case of a short-circuit, the first switch 108 is open (the signal «RELAY 1» shifts to the lower value from $t_2$ on).

If the determined voltage is higher than the short-circuit threshold value, as in the timing diagram of FIG. 2, a pre-charge stage of the bulk capacitor 118 is carried out. The second thyristor 114 is turned off (the signal «CTRL2» switches to the lower value) and the first thyristor 112 that is forward-biased is turned on by the control circuit 124 applying the higher value «CTRL1» signal onto the gate of the first thyristor 112. Then, the storage capacitor 118 is charged faster than for the phase of detection of short-circuit, since the current through the storage capacitor 118 is just restricted by the pre-charging resistor 116 and no more by the reverse-bias of the second thyristor 114.

The moment $t_3$ on the FIG. 2 corresponds to the moment when the desired pre-charging voltage value is reached at the terminals of the storage capacitor 118. For example, this desired value of pre-charge voltage may be between 80% and 90% of the voltage at terminals of the voltage source 102. The control signal applied to the gate of the first thyristor 112 is thus withdrawn ("CTRL1" signal switching to the low value) and the second switch element 110 is closed. Then, the first thyristor 112 is switched to the off state because the current passes through the second switch element 110 instead of the first thyristor 112, which connects the voltage source 102 to the bus (the first switch 108 remains closed after the moment $t_3$).

Thus, by controlling the various elements of the device 100 as described above, the current through the bus is monitored before the start of the pre-charging of the storage capacitor 118, which prevents the implementation of such a pre-charging in case of detection of a short-circuit on the bus. In addition, the integrity of any fuse between the voltage source 102 and the bus is preserved.

When the voltage source 102 is disconnected from the bus, for example when stopping the vehicle, after (or even during) the pre-charging of the storage capacitor 118, the control circuit 124 turns on the third thyristor 120 and opens the first and second switches 108, 110. Then, the storage capacitor 118 is discharging through the discharge resistor 122 that restricts the value of the current at this discharge phase.

Figure 4:
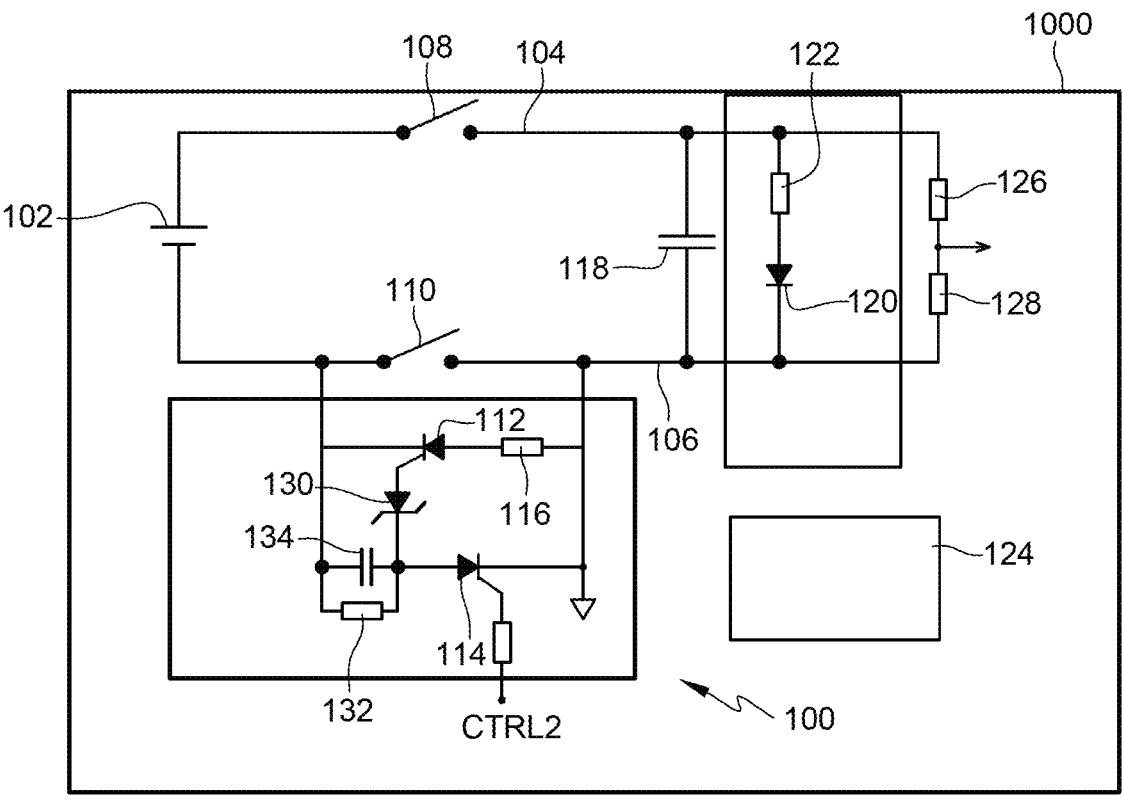
FIG. 4 schematically represents a second example embodiment of a short-circuit detection device according to a particular embodiment.

A second example embodiment of a short-circuit detection device 100 is described below in relation with the FIG. 4.

The device 100 according to the second example embodiment comprises all the elements of the device 100 according to the first example embodiment as described above in relation with the FIG. 1.

Besides these elements, the device 100 according to this second example embodiment comprises a Zener diode 130, the anode of which is coupled to the gate of the first thyristor 112. The cathode of the Zener diode 130 is coupled to a terminal of a RC circuit comprising a resistor 132 and a capacitor 134, and to the anode of the second thyristor 114. A second terminal of the RC circuit is coupled to the cathode of the first thyristor 112.

A chronogram of the signals of the device 100 according to the second example embodiment when detecting a short-circuit prior to connection to the voltage source 102 to the bus is shown in the FIG. 5.

In this chronogram, the various signals shown match those previously described in relation with the FIGS. 2 and 3, except the signal «VC2» that corresponds with the voltage at the terminals of the Zener diode 130.

Between the moments 0 and $t_1$, which means during the initial measurement of the voltage at the terminals of the storage capacitor 118, the voltage at the terminals of the Zener diode 130 remains zero. The other signals are similar to those previously described in relation with the FIGS. 2 and 3. As previously, if the voltage at terminals of the storage capacitor 118 determined during this first stage is higher than the short-circuit threshold, this means that a short-circuit is not present in the direct current circuit. The method may then implement the pre-charge stage of the storage capacitor 118. If the voltage remains lower or equal to this threshold value, this means that the storage capacitor 118 is not electrically charged or that a short-circuit is present in the direct current circuit. In this case, the method does not implement the pre-charge stage and reports the detection of a potential short-circuit.

Between the moments $t_1$ et $t_2$ (short-circuit detection phase), the second thyristor 114 is reverse-biased and conducts a weak reverse current that slowly charges the storage capacitor 118. The reverse current also charges the capacitor 134, hence increasing the voltage VC2 at the terminals of the Zener diode 130. Then, the voltage at the terminals of the storage capacitor 118 is determined, and if it is higher than the threshold of short-circuit, the pre-charging phase of the storage capacitor 118 starts. If it is equal to or lower than the threshold of short-circuit, the second thyristor 114 is off and the switches 108, 110 are open.

In the example of FIG. 5, at the moment $t_2$, the pre-charging phase of the storage capacitor 118 starts. The first thyristor 112 is turned on thanks to the control signal that is automatically applied onto the gate of the first thyristor 112 by the Zener diode 130 thanks to the increase of the voltage at the terminals of the Zener diode 130 during the short-circuit detection phase. The moment $t_3$ symbolically shows the switch of the second thyristor 114 to the off state. If a short-circuit had been detected in the circuit, the control signal applied to the gate of the second thyristor 114 is withdrawn before the voltage at terminals of the capacitor 134 reaches the value of the threshold voltage of the Zener diode 130 to avoid a start, and thus a turning on, of the first thyristor 112.

The moment $t_4$ on the FIG. 5 corresponds to the moment when the desired pre-charging voltage value is reached at the terminals of the storage capacitor 118. Then, the second thyristor 110 is closed, which connects the voltage source 102 to the bus (the first switch 108 remains closed after the moment $t_4$).

Like in the first embodiment described above, by controlling the various elements of the device 100 according to a second embodiment, the current through the bus is monitored before the start of the pre-charging of the storage capacitor 118 that is triggered automatically, and prevents the implementation of such a pre-charging in case of detection of a short-circuit on the bus.

As in the first embodiment, when the voltage source 112 should be disconnected from the bus, the control circuit 124 opens the first and second switch elements 108, 110 and then turns on the third thyristor 120. Then, the storage capacitor 118 is discharging through the discharge resistor 122.

The different variants as described above in relation with the first example embodiment of the device 100 also apply to the second example embodiment of the device 100.

The short-circuit detection device 100, as described above in the context of a system to control the battery 1000 of a vehicle, relies on the use of a reverse-biased thyristor that conducts a non-zero reverse current during a short-circuit detection phase of detection of short-circuits to increase the voltage at the terminals of the storage capacitor coupled to the bus, and checks whether there is a short-circuit or not before triggering the pre-charging of the storage capacitor if no short-circuit has been detected.

Such a device 100 may also apply inside an electrical power converter 2000. An example of such a converter 2000 is described below in relation with the FIG. 6.

Figure 6:
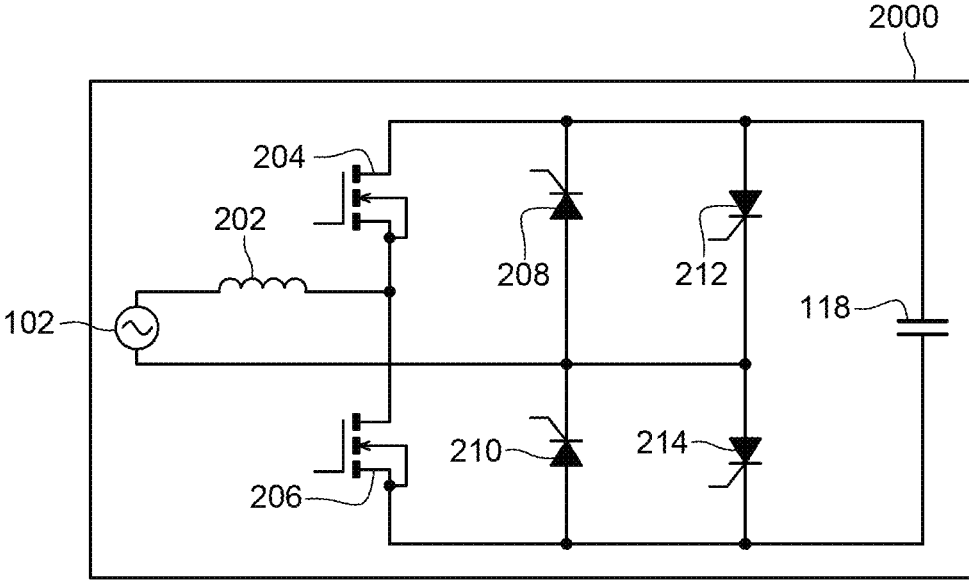
FIG. 6 schematically represents an example embodiment of an electrical power converter comprising a short-circuit detection device according to a particular embodiment.

In the example of the FIG. 6, the converter 2000 is a bidirectional totem pole PFC («Power Factor Corrector») that allows a conversion or an adaptation of an alternative voltage into a direct voltage, or conversely a conversion or an adaptation of a direct voltage into an alternative voltage.

In this embodiment, the voltage source 102 is an alternative voltage source with one terminal coupled to the inductive element 202. In addition, the converter 200 comprises commutation cells that are made of two transistors 204, 206 and four thyristors 208, 210, 212 and 214. The commutation arms of the converter 2000 are coupled in parallel with the storage capacitor 118. The control circuit 124 that notably controls the commutation of the transistors and thyristors of the converter 2000 cannot be seen in this FIG. 6.

When the converter 2000 makes a conversion or an adaptation of an alternative voltage into a direct voltage, the elements used for the commutations are the transistors 204, 206 and the two thyristors 208, 210. When the converter 2000 makes a conversion or an adaptation of a direct voltage into an alternative voltage, the elements used for the commutations are the transistors 204, 206 and the two other thyristors 212, 214. Thus, in both cases, the two thyristors not used for commutation are controlled by the control circuit 124 similarly as the first and second thyristors 112, 114 as previously described for the system to control the battery 1000 of a vehicle, which means by using the reverse-biased thyristor to achieve a reverse conduction that charges the storage capacitor 118, then the other forward-biased thyristor to achieve the pre-charge of the storage capacitor 118 if the voltage at the terminals of the storage capacitor 118 is higher than the threshold of short-circuit.

The device 100 may be used for other kinds of converter, for example one-way converters such as a converter integrating a mixed bridge coupled to a «Boost» circuit.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

A short-circuit detection device (100) may be summarized as being for detecting short-circuits in a direct current circuit, including at least one voltage source (102), a bus including at least two conducting elements (104, 106) each coupled to either one of the terminals of the voltage source (102), first and second thyristors (112, 114) coupled to the voltage source (102) and to the bus, and at least one capacitive element forming a storage capacitor (118), electrodes of which are each coupled to either one of the conducting elements (104, 106) of the bus, wherein the short-circuit detection device (100) includes at least one control circuit (124) configured to control the biasing and the modes of operation of the first and second thyristors (112, 114) such that: during a detection phase of a short-circuit, the first thyristor (112) is set to an off state and the second thyristor (114) is reverse-biased and conducts a non-zero reverse current that charges the storage capacitor (118), then a voltage at the terminals of the storage capacitor (118) is determined; then if the determined voltage at the terminals of the storage capacitor (118) is lower than or equal to a short-circuit threshold value, the first and second thyristors (112, 114) are turned off, or if the determined voltage at the terminals of the storage capacitor (118) is higher than the short-circuit threshold value, the storage capacitor (118) is pre-charged by turning off the second thyristor (114) and by turning on the first thyristor (112).

The short-circuit threshold value may be equal to 0.

The voltage source (102) may be a direct voltage source including at least one battery; the direct current circuit may include at least a first switch (108) coupling a positive terminal of the battery to a first one of the two conducting elements (104) of the bus, and at least a second switch (110) coupling a negative terminal of the battery to a second one of the two conducting elements (106) of the bus; at least one of the first and second switches (108, 110) may be a relay; the direct current circuit may include a discharge circuit of the storage capacitor (118) including at least a third switch (120) coupled in series with at least one discharge resistor (122), the discharge circuit being coupled in parallel with the storage capacitor (118); the first thyristor (112) may be part of a pre-charging circuit that also includes a pre-charging resistor (116) coupled in series with the first thyristor (112), wherein the pre-charging circuit is coupled in parallel with one of the first and second switches (108, 110), and such that the cathode of the first thyristor (112) is coupled to the negative terminal of the battery or the anode of the first thyristor (112) is coupled to the positive terminal of the battery; the second thyristor (114) may be coupled in parallel with one of the first and second switches (108, 110) and such that the anode of the second thyristor (114) is coupled to the negative terminal of the battery or the cathode of the second thyristor (114) is coupled to the positive terminal of the battery.

The control circuit (124) may be configured to apply control signals to gates of the first and second thyristors (112, 114), or the short-circuit detection device (100) may further include a Zener diode (130) and an RC circuit (132, 134), the anode of the Zener diode (130) being coupled to the gate of the first thyristor (112), the cathode of the Zener diode (130) being coupled to the anode of the second thyristor (114) and to a first terminal of the RC circuit (132, 134), a second terminal of the RC circuit (132, 134) being coupled to the cathode of the first thyristor (112).

The control circuit (124) may be configured to: before the short-circuit detection phase, close the first switch (108), then perform an initial measurement of the voltage at the terminals of the storage capacitor (118); then initiate the short-circuit detection phase if the initial voltage measurement at the terminals of the storage capacitor (118) is lower than or equal to the short-circuit threshold value, or directly pre-charge the storage capacitor (118) if the voltage initially measured at terminals of the storage capacitor (118) is higher than the threshold value of short-circuit.

If the anode of the second thyristor (114) is coupled to the negative terminal of the battery, the control circuit (124) may be configured to control the first switch (108) so that it is on during the short-circuit detection phase and during the pre-charging of the storage capacitor (118).

The control circuit (124) may be configured such that, after the pre-charging of the storage capacitor (118), the first and second switches (108, 110) are turned on and the first and second thyristors (112, 114) are turned off.

The third switch (120) may be a third thyristor, and the control circuit (124) may be configured to apply a control signal to the gate of the third thyristor.

During a disconnection phase of the battery from the bus performed after the pre-charging of the storage capacitor (118), the control circuit (124) may be configured to turn on the third switch (120) after the opening of the first and second switches (108, 110).

During the measurement of the voltage at the terminals of the storage capacitor (118) implemented during the short-circuit detection phase, the control circuit (124) may be configured to turn off the second thyristor (114).

A vehicle battery control system (1000) may be summarized as including at least one short-circuit detection device (100) according to embodiments discussed above.

An electrical power converter (2000) may be summarized as including at least one short-circuit detection device (100) according embodiments discussed above.

The first and second thyristors (112, 114) may be part of commutation cells of the electrical power converter (2000).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A short-circuit detection device, comprising:
a control circuit coupled to a direct current circuit, the direct current circuit including:
a voltage source having terminals;
a bus including at least two conducting elements, each of the at least two conducting elements coupled to either one of the terminals of the voltage source;
first and second thyristors coupled to the voltage source and to the bus; and
at least one capacitive element that forms a storage capacitor including terminals and electrodes, each of the electrodes of the storage capacitor being coupled to either one of the at least two conducting elements of the bus,
wherein the control circuit is configured to control biasing and modes of operation of the first and second thyristors such that:

during a detection phase of a short-circuit, the first thyristor is set to an off state and the second thyristor is reverse-biased and conducts a non-zero reverse current that charges the storage capacitor; and
if a voltage at the terminals of the storage capacitor is lower than or equal to a short-circuit threshold value, the first and second thyristors are set to an off state, or if the voltage at the terminals of the storage capacitor is higher than the short-circuit threshold value, the first thyristor is set to an on state and the second thyristor is set to an off state to pre-charge the storage capacitor.

2. The short-circuit detection device according to claim 1, where the short-circuit threshold value is equal to 0.

3. The short-circuit detection device according to claim 1, wherein:
the voltage source is a direct voltage source including a battery;
the direct current circuit includes a first switch coupling a positive terminal of the battery to a first one of the at least two conducting elements of the bus, and a second switch coupling a negative terminal of the battery to a second one of the at least two conducting elements of the bus;
at least one of the first or second switches is a relay;
the direct current circuit includes a discharge circuit of the storage capacitor including a third switch coupled in series with a discharge resistor, the discharge circuit being coupled in parallel with the storage capacitor;
the first thyristor is part of a pre-charging circuit that includes a pre-charging resistor coupled in series with the first thyristor, the pre-charging circuit coupled in parallel with one of the first or second switches, a cathode of the first thyristor being coupled to the negative terminal of the battery or an anode of the first thyristor being coupled to the positive terminal of the battery;
the second thyristor is coupled in parallel with one of the first or second switches, an anode of the second thyristor being coupled to the negative terminal of the battery or a cathode of the second thyristor being coupled to the positive terminal of the battery.

4. The short-circuit detection device according to claim 3, wherein:
the control circuit is configured to apply control signals to gates of the first and second thyristors, or
the short-circuit detection device includes a Zener diode and an RC circuit, an anode of the Zener diode being coupled to the gate of the first thyristor, a cathode of the Zener diode being coupled to the anode of the second thyristor and to a first terminal of the RC circuit, a second terminal of the RC circuit being coupled to the cathode of the first thyristor.

5. The short-circuit detection device according to claim 3, wherein the control circuit is configured to:
before the detection phase, close the first switch, and perform an initial measurement of the voltage at the terminals of the storage capacitor;
initiate the detection phase if the initial measurement of the voltage is lower than or equal to the short-circuit threshold value, or directly pre-charge the storage capacitor if the initial measurement of the voltage is higher than the short-circuit threshold value.

6. The short-circuit detection device according to claim 3, wherein, if the anode of the second thyristor is coupled to the negative terminal of the battery, the control circuit is configured to control the first switch so that the first switch is in an on state during the detection phase and during the pre-charge of the storage capacitor.

7. The short-circuit detection device according to claim 3, wherein the control circuit is configured to, after the pre-charge of the storage capacitor, set the first and second switches to an on state and set the first and second thyristors to an off state.

8. The short-circuit detection device according to claim 3, wherein the third switch is a third thyristor, and the control circuit is configured to apply a control signal to a gate of the third thyristor.

9. The short-circuit detection device according to claim 3, wherein, during a disconnection phase of the battery from the bus performed after the pre-charge of the storage capacitor, the control circuit is configured to turn on the third switch after opening of the first and second switches.

10. The short-circuit detection device according to claim 3, wherein, during measurement of the voltage at the terminals of the storage capacitor performed during the detection phase, the control circuit is configured to set the second thyristor to an off state.

11. A system comprising:
  a direct current circuit including:
    a voltage source having terminals;
    a bus including at least two conducting elements, each of the at least two conducting elements coupled to either one of the terminals of the voltage source;
    first and second thyristors coupled to the voltage source and to the bus; and
    at least one capacitive element that forms a storage capacitor including terminals and electrodes, each of the electrodes of the storage capacitor being coupled to either one of the at least two conducting elements of the bus; and
  a short-circuit detection device including a control circuit configured to control biasing and modes of operation of the first and second thyristors such that:
    during a detection phase of a short-circuit, the first thyristor is set to an off state and the second thyristor is reverse-biased and conducts a non-zero reverse current that charges the storage capacitor; and
    if a voltage at the terminals of the storage capacitor is lower than or equal to a short-circuit threshold value, the first and second thyristors are set to an off state, or if the voltage at the terminals of the storage capacitor is higher than the short-circuit threshold value, the first thyristor is set to an on state and the second thyristor is set to an off state to pre-charge the storage capacitor.

12. The system according to claim 11, wherein:
  the voltage source is a direct voltage source including a battery;
  the direct current circuit includes a first switch coupling a positive terminal of the battery to a first one of the at least two conducting elements of the bus, and a second switch coupling a negative terminal of the battery to a second one of the at least two conducting elements of the bus;
  at least one of the first or second switches is a relay;
  the direct current circuit includes a discharge circuit of the storage capacitor including a third switch coupled in series with a discharge resistor, the discharge circuit being coupled in parallel with the storage capacitor;
  the first thyristor is part of a pre-charging circuit that includes a pre-charging resistor coupled in series with the first thyristor, the pre-charging circuit coupled in parallel with one of the first or second switches, a cathode of the first thyristor being coupled to the negative terminal of the battery or an anode of the first thyristor being coupled to the positive terminal of the battery;
  the second thyristor is coupled in parallel with one of the first or second switches, an anode of the second thyristor being coupled to the negative terminal of the battery or a cathode of the second thyristor being coupled to the positive terminal of the battery.

13. The system according to claim 12, wherein:
  the control circuit is configured to apply control signals to gates of the first and second thyristors, or
  the short-circuit detection device includes a Zener diode and an RC circuit, an anode of the Zener diode being coupled to the gate of the first thyristor, a cathode of the Zener diode being coupled to the anode of the second thyristor and to a first terminal of the RC circuit, a second terminal of the RC circuit being coupled to the cathode of the first thyristor.

14. The system according to claim 12, wherein the control circuit is configured to:
  before the detection phase, close the first switch, and perform an initial measurement of the voltage at the terminals of the storage capacitor;
  initiate the detection phase if the initial measurement of the voltage is lower than or equal to the short-circuit threshold value, or directly pre-charge the storage capacitor if the initial measurement of the voltage is higher than the short-circuit threshold value.

15. The system according to claim 12, wherein the control circuit is configured to, after the pre-charge of the storage capacitor, set the first and second switches to an on state and set the first and second thyristors to an off state.

16. The system according to claim 12, wherein, during a disconnection phase of the battery from the bus performed after the pre-charge of the storage capacitor, the control circuit is configured to turn on the third switch after opening of the first and second switches.

17. An electrical power converter comprising:
  at least one short-circuit detection device including:
    a control circuit coupled to a direct current circuit, the direct current circuit including:
      a voltage source having terminals;
      a bus including at least two conducting elements, each of the at least two conducting elements coupled to either one of the terminals of the voltage source;
      first and second thyristors coupled to the voltage source and to the bus; and
      at least one capacitive element that forms a storage capacitor including terminals and electrodes, each of the electrodes of the storage capacitor being coupled to either one of the at least two conducting elements of the bus,
    wherein the control circuit is configured to control biasing and modes of operation of the first and second thyristors such that:
      during a detection phase of a short-circuit, the first thyristor is set to an off state and the second thyristor is reverse-biased and conducts a non-zero reverse current that charges the storage capacitor; and
      if a voltage at the terminals of the storage capacitor is lower than or equal to a short-circuit threshold value, the first and second thyristors are set to an off state, or if the voltage at the terminals of the storage capacitor is higher than the short-circuit threshold value, the first thyristor is set to an on state and the second thyristor is set to an off state to pre-charge the storage capacitor.

18. The electrical power converter according to claim 17, wherein the first and second thyristors are part of commutation cells of the electrical power converter.

19. The electrical power converter according to claim 17, wherein:

the voltage source is a direct voltage source including a battery;

the direct current circuit includes a first switch coupling a positive terminal of the battery to a first one of the at least two conducting elements of the bus, and a second switch coupling a negative terminal of the battery to a second one of the at least two conducting elements of the bus;

at least one of the first or second switches is a relay;

the direct current circuit includes a discharge circuit of the storage capacitor including a third switch coupled in series with a discharge resistor, the discharge circuit being coupled in parallel with the storage capacitor;

the first thyristor is part of a pre-charging circuit that includes a pre-charging resistor coupled in series with the first thyristor, the pre-charging circuit coupled in parallel with one of the first or second switches, a cathode of the first thyristor being coupled to the negative terminal of the battery or an anode of the first thyristor being coupled to the positive terminal of the battery;

the second thyristor is coupled in parallel with one of the first or second switches, an anode of the second thyristor being coupled to the negative terminal of the battery or a cathode of the second thyristor being coupled to the positive terminal of the battery.

20. The electrical power converter according to claim 19, wherein:

the control circuit is configured to apply control signals to gates of the first and second thyristors, or the short-circuit detection device includes a Zener diode and an RC circuit, an anode of the Zener diode being coupled to the gate of the first thyristor, a cathode of the Zener diode being coupled to the anode of the second thyristor and to a first terminal of the RC circuit, a second terminal of the RC circuit being coupled to the cathode of the first thyristor.

* * * * *